(12) United States Patent
Itoh et al.

(10) Patent No.: US 6,249,534 B1
(45) Date of Patent: Jun. 19, 2001

(54) NITRIDE SEMICONDUCTOR LASER DEVICE

(75) Inventors: Kunio Itoh, Kyoto; Masaaki Yuri, Osaka; Tadao Hashimoto, Hyogo; Masahiro Ishida, Osaka, all of (JP)

(73) Assignee: Matsushita Electronics Corporation, Osaka (JP)

( * ) Notice: Subject to any disclaimer, the term of this patent is extended or adjusted under 35 U.S.C. 154(b) by 0 days.

(21) Appl. No.: 09/285,648

(22) Filed: Apr. 5, 1999

(30) Foreign Application Priority Data

| Apr. 6, 1998 | (JP) | 10-093086 |
| May 21, 1998 | (JP) | 10-139443 |
| May 29, 1998 | (JP) | 10-148996 |

(51) Int. Cl.$^7$ ................................................ H01S 5/028
(52) U.S. Cl. ................................................ 372/49
(58) Field of Search ................................................ 372/49

(56) References Cited

U.S. PATENT DOCUMENTS

| 5,321,713 | 6/1994 | Khan et al. | 372/45 |
| 5,799,028 | * 8/1998 | Geels et al. | 372/49 |

FOREIGN PATENT DOCUMENTS

| 0 772 249 A2 | 5/1997 | (EP) . |
| 3-209895 | 9/1991 | (JP) . |
| 4-208585 | 7/1992 | (JP) . |
| 6-268327 | 9/1994 | (JP) . |
| 8-191171 | 7/1996 | (JP) . |
| 9-219556 | 8/1997 | (JP) . |

OTHER PUBLICATIONS

Shuji Nakamura, RT–CW Operation of InGaN Multi–Quantum–Well Structure Laser Diodes., Department of Research and Development, Materials Science and Engineering B50 (1997) 277–284 (No Month).

European Serach Report dated Dec. 10, 1999.

Patent Abstract of Japanese Publication No. 58089890, Published on May 28, 1983, Application No. 56187039, Filed on Nov. 24, 1981. Applicant is Hitachi Ltd., Inventor Sakaki Shigeo, "Laser Device".

Patent Abstract of Japanese Publication No. 02137287, Published on May 25, 1990, Application No. 63291437, Filed on Nov. 17, 1988. Application is Sanyo Electric Co., Ltd, Inventor Hamada Hiroyoshi, Semiconductor Laser Device.

Patent Abstract of Japanese Publication No. 61134094, Published on Jun. 21, 1986, Application No. 59256664, Filed on Dec. 5, 1984. Applicant is NEC Corp, Inventor Ishikawa Makoto, "Semiconductor Laser".

Patent Abstract of Japanese Publication No. 59009989, Published on Jan. 1, 1984, Application No. 57118965, Filed on Jul. 7, 1982. Applicant is Matsushita Electric IND CO LTD, Inventor Shimizu Yuichi, "Optical Semiconductor Element".

* cited by examiner

Primary Examiner—James W. Davie
(74) Attorney, Agent, or Firm—Eric J. Robinson; Nixon Peabody LLP

(57) ABSTRACT

The nitride semiconductor laser device of the present invention includes: a nitride semiconductor laser diode; and a protective layer formed on at least one facet of the nitride semiconductor laser diode. The protective layer is made of $Al_{1-x-y-z}Ga_xIn_yB_aN$ (where $0 \leq x, y, z \leq 1$ and $0 \leq x+y+z \leq 1$), which is transparent to light emitted from the laser diode.

13 Claims, 12 Drawing Sheets

NITRIDE SEMICONDUCTOR LASER DEVICE

BACKGROUND OF THE INVENTION

The present invention relates to a nitride semiconductor laser device.

A semiconductor laser device using a nitride semiconductor such as GaN, InN or AlN can generate light in the green to blue regions and is expected to be a light source for a high-density optical disk apparatus. A nitride semiconductor laser device of the type emitting light in the blue part of the spectrum will be described as an exemplary prior art device.

FIG. 11 illustrates a conventional nitride semiconductor laser device 600. In the device 600, n-type GaN electrode forming layer 62 (including upper and lower parts 62a and 62b) n-type GaAlN cladding layer 63, InGaN/GaN multi-quantum well (MQW) active layer 64, p-type GaAlN cladding layer 65 and p-type GaN electrode forming layer 66 are formed in this order on a sapphire substrate 61. An electrode provided on the n-type side (n-type electrode) 67, made up of multiple pairs of Ti/Al layers alternately stacked, is formed on the lower part 62a of the n-type electrode forming layer 62. On the other hand, an electrode provided on the p-type side (p-type electrode) 68, made up of multiple pairs of Ni/Au layers alternately stacked, is formed on the p-type electrode forming layer 66. In this manner, a laser diode 60, also called a "laser element or cavity" is formed. On both facets of the laser diode 60, from/by which laser light is emitted or reflected, a pair of $SiO_2$ or SiN protective layers 69 are provided, thus preventing the deterioration of the laser facets. In this case, $SiO_2$ or SiN need not have their compositions exactly defined by stoichiometry. Instead, these layers 69 should have resistivity (or insulating properties) and refractive index that are substantially equal to those of $SiO_2$ or SiN. In this specification, part of a semiconductor laser device, from which stimulated emission of radiation is produced, will be referred to as a "semiconductor laser diode", and a combination of the semiconductor laser diode with at least one protective or reflective layer a "semiconductor laser device" for convenience.

The conventional nitride semiconductor laser device 600 may be fabricated by the following method. First, the electrode forming layer 62, cladding layer 63, MQW active layer 64, cladding layer 65 and electrode forming layer 66 are formed in this order by a crystal-growing technique on the sapphire substrate 61. Thereafter, respective portions of the electrode forming layer 66, cladding layer 65, MQW active layer 64, cladding layer 63 and upper part 62b of the electrode forming layer 62 are etched, thereby exposing the upper surface of the lower part 62a of the electrode forming layer 62. The n- and p-type electrodes 67 and 68 are formed on the exposed upper surface of the electrode forming layer 62a and the electrode forming layer 66, respectively, by an evaporation technique. Thereafter, the pair of protective layers 69 are formed on both laser facets by a sputtering or electron beam (EB) evaporation technique.

FIGS. 12A and 12B illustrate another conventional nitride semiconductor laser device 700. The device 700 includes: n-type GaAlN cladding layer 72; InGaN/GaN MQW active layer 74; p-type GaAlN cladding layer 75; and p-type GaN electrode forming layer 76, which are stacked in this order on a sapphire substrate 72 by a crystal-growing technique. An Ni/Au electrode 77 and a Ti/Al electrode 71 are formed on the upper and lower surfaces of this multilayer structure to form a laser diode 70. In order to reduce the operating current of this laser diode 70, a reflective layer 90, made up of four pairs of $SiO_2/TiO_2$ layers 91, 92 alternately stacked with the thickness of each layer defined as $\lambda/4n$ (n is a refractive index of each layer 91 or 92), is formed on the rear facet, or the back, of the laser diode 70. On the front facet, or the front, of the laser diode 70, an $SiO_2$ protective layer 80 is formed at a thickness defined as $\lambda/2n$ (n is a refractive index of the protective layer 80). Herein, $\lambda$ is an oscillation wavelength of the laser diode 70. The stimulated emission of radiation is output from the front. The front protective layer 80 and the rear reflective layer 90 are deposited by a sputtering or EB evaporation technique.

By providing the reflective layer 90 on the back, the reflectance of the back increases to about 98%, and almost all laser light can be emitted from the front. As a result, the operating current can be reduced to about 70% of that consumed by a semiconductor laser device with only an $SiO_2$ protective layer formed on its back at an ordinary thickness defined by $\lambda/2n$.

However, the lifetime of the conventional nitride semiconductor laser devices 600 and 700 are short particularly when operating at high output power. The present inventors found that the lifetime of these nitride semiconductor laser devices are short because of the following reasons:

(1) the laser diodes 60 and 70 are made up of a plurality of crystal layers, whereas the protective layers 69 and 80 and the reflective layer 90, formed on the facets thereof are formed of $SiO_2$ or $TiO_2$ and are all amorphous layers. In addition, the length of a bond in the material for these amorphous layers (e.g., the length of an Si—O bond) is different from the lattice constant of the crystal layers in the laser diodes. Accordingly, lattice mismatching is caused in these interfaces to create lattice defects in these crystal layers (in the MQW active layer, in particular). Moreover, if the protective layers 69 and 80 and the reflective layer 90 are formed on the laser facets by a sputtering or EB evaporation technique, then these laser facets would be damaged due to relatively high impact energy of material particles flying from the target. As a result, lattice defects might be caused in the crystal layers in the laser diodes 60 and 70.

(2) The thermal expansion coefficients of the crystal layers in the laser diodes 60 and 70 are greatly different from those of the protective layers 69 and 80 and the reflective layer 90. Accordingly, the crystal layers (the MQW active layer, in particular) are strained while the protective layers 69 and 80 and the reflective layer 90 are cooled down to room temperature after these layers have been formed and during the operation of the devices (during high-power operation, in particular). As a result, crystal defects are newly created or the number thereof increases. For example, the thermal expansion coefficient of the MQW active layer 64 is $3.15 \times 10^{-6}$ $k^{-1}$, which is greatly different from that of the protective layer 69 at $1.6 \times 10^{-7}$ $k^{-1}$.

SUMMARY OF THE INVENTION

An object of the present invention is providing a nitride semiconductor laser device with a much longer lifetime and higher reliability than those of a conventional device.

A nitride semiconductor laser device according to the present invention includes: a nitride semiconductor laser diode; and a protective layer formed on at least one facet of the nitride semiconductor laser diode. The protective layer is made of $Al_{1-x-y-z}Ga_xIn_yB_zN$ (where $0 \leq x, y, z \leq 1$ and $0 \leq x+y+z \leq 1$), which is transparent to light emitted from the laser diode In one embodiment of the present invention, the thickness of the protective layer is preferably N times as large as $\lambda/2n$, where N is a positive integer. $\lambda$ is an oscillation wavelength of the light emitted from the laser diode and n is a refractive index of the protective layer.

In another embodiment of the present invention, the nitride semiconductor laser diode preferably includes a multi-quantum well active layer made up of a multiple pairs of $In_uGa_{1-u}N$ and $In_vGa_{1-v}N$ (where $0 \leq u$, $v \leq 1$) layers alternately stacked one upon the other.

In still another embodiment, the protective layer is preferably formed by an MOCVD or MBE process.

In yet another embodiment, the device preferably further includes a reflective layer in contact with the protective layer, the reflective layer reflecting the light emitted from the laser diode.

In that embodiment, the reflective layer is preferably made up of at least one pair of first and second layers, which have mutually different refractive indices and are alternately stacked one upon the other.

Specifically, the thickness of the first and second layers are preferably defined by $\lambda/4n_1$ and $\lambda/4n_2$, respectively where $\lambda$ is an oscillation wavelength of the light emitted from the laser diode and $n_1$ and $n_2$ are refractive indices of the first or second layer, respectively.

In an alternate embodiment, the thickness of the protective layer may be N times as large as $\lambda/2n$, where N is a positive integer, $\lambda$ is an oscillation wavelength of the light emitted from the laser diode and n is a refractive index of the protective layer.

In another alternate embodiment, the thickness of the protective layer may also be defined by $\lambda/4n$, where $\lambda$ is an oscillation wavelength of the light emitted from the laser diode and n is a refractive index of the protective layer.

In another embodiment, the protective layer may be made of GaN, and the first and second layers may be made of $SiO_2$ and $TiO_2$, respectively, or two types of $Al_{1-\alpha-\beta-\gamma}Ga_\alpha In_\beta B_\gamma N$ (where $0 \leq \alpha, \beta, \gamma \leq 1$ and $0 \leq \alpha+\beta+\gamma \leq 1$), which have mutually different refractive indices and are transparent to light emitted from the laser diode.

In still another embodiment, the reflective layer may further include a third layer between the first and second layers. The first, second and third layers are preferably all crystal layers, and a difference in lattice constant between the first and third layers is preferably smaller than a difference in lattice constant between the first and second layers.

In yet another embodiment, the protective layer is preferably made of GaN, and the reflective layer, which is made up of the first, third and second layers stacked in this order, preferably has a GaN/AlGaN/AlN structure.

In yet another embodiment, the protective layer and the reflective layer are preferably formed by an MOCVD or MBE process.

DESCRIPTION OF THE PREFERRED EMBODIMENTS

EMBODIMENT 1

Figure 1:
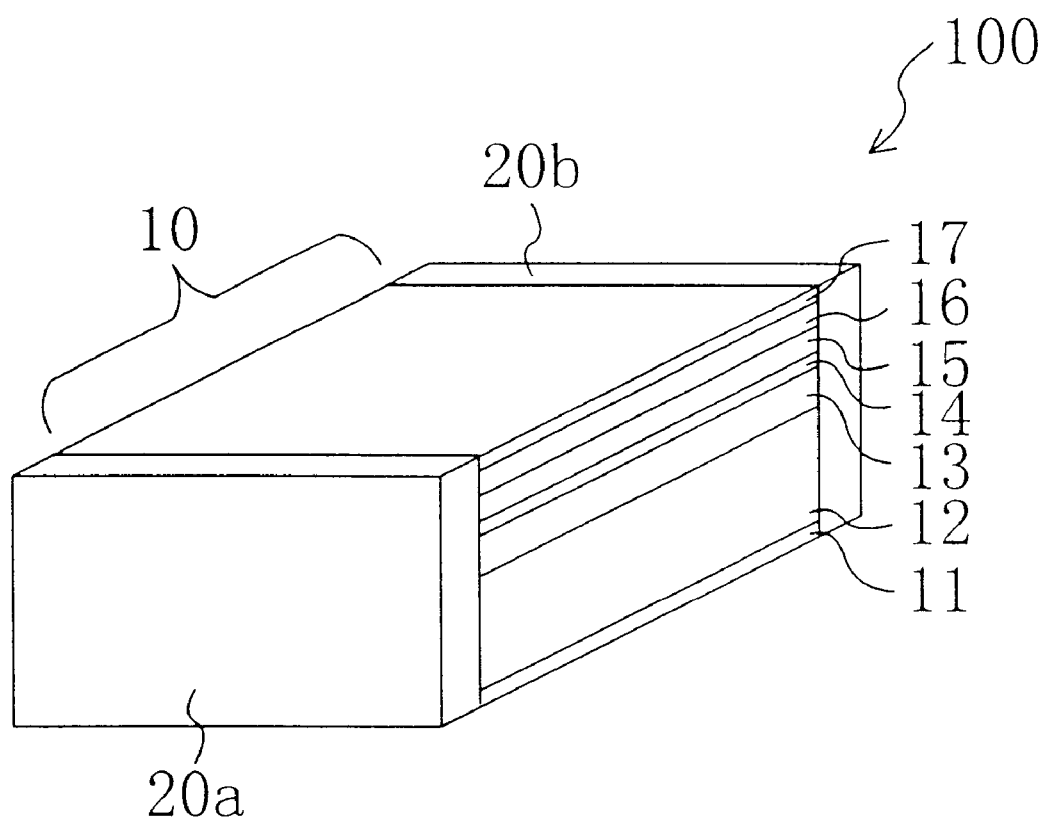
FIG. 1 is a perspective view of a nitride semiconductor laser device according to a first embodiment of the present invention.

FIG. 1 is a perspective view of a nitride semiconductor laser device 100, emitting light in the blue region, according to a first embodiment of the present invention.

The device 100 includes a nitride semiconductor laser diode 10 and a pair of GaN protective layers 20a and 20b, which are provided on both laser facets of the diode 10. The protective layers 20a and 20b are transparent to the light emitted from the laser diode 10. In other words, GaN, which is the material of the protective layers 20a and 20b, has a band gap larger than that of the optical energy of the radiation emitted from the laser diode 10. The protective layers 20a and 20b are not necessarily made of GaN, but may be made of any other semiconductor material that is transparent to the light emitted from the laser diode 10.

The nitride semiconductor laser diode 10 has the following structure. An n-type electrode 11, made up of multiple pairs of Ti/Al layers alternately stacked, is formed under an n-type GaN substrate 12. On the substrate 12, Si-doped n-type $Ga_{0.9}Al_{0.1}N$ cladding layer 13, MQW active layer 14, Mg-doped p-type $Ga_{0.9}Al_{0.1}N$ cladding layer 15, Mg-doped p-type GaN electrode forming layer 16 and p-type electrode 17 are formed in this order. The MQW active layer 14 is made up of multiple pairs of undoped $In_{0.02}Ga_{0.98}N/In_{0.15}Ga_{0.85}N$ layers alternately stacked. And the p-type electrode 17 is made up of multiple pairs of Ni/Au layers alternately stacked. The protective layers 20a and 20b are provided on the both facets of the laser diode 10.

Hereinafter, a method for fabricating this blue-light-emitting nitride semiconductor laser device 100 will be described with reference to FIGS. 2A, 2B, 2C and 2D.

Figure 2A:
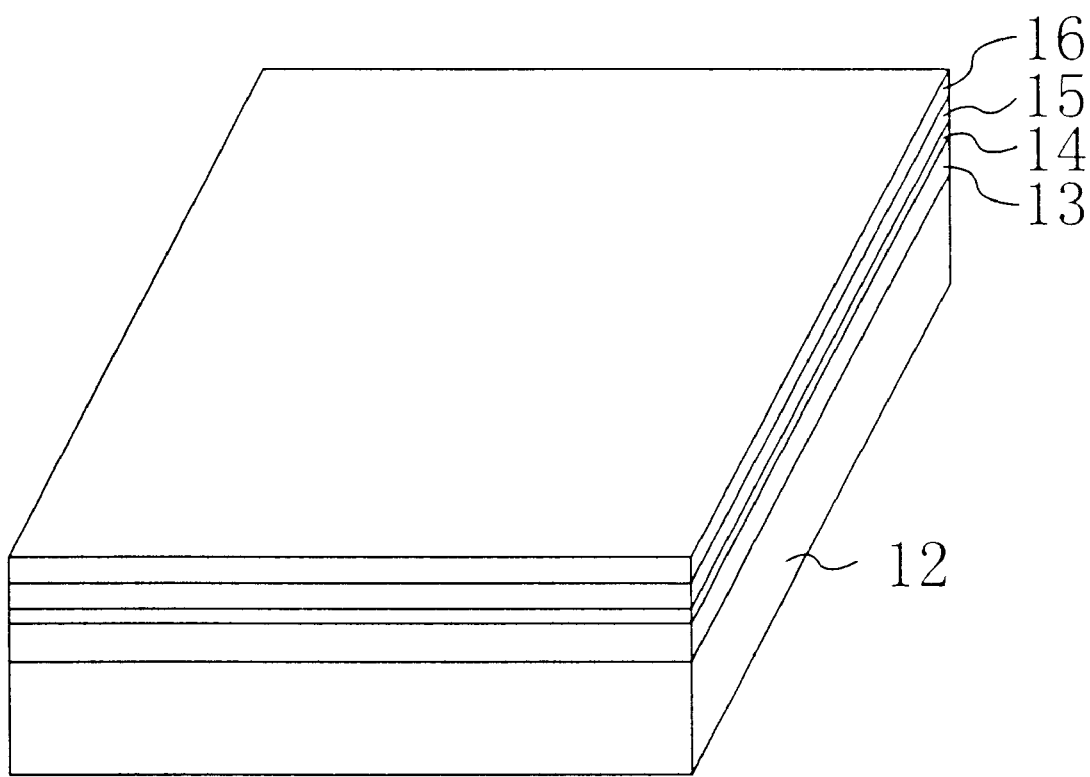
FIGS. 2A through 2D are perspective views illustrating respective process steps for fabricating the nitride semiconductor laser device of the first embodiment.

First, as shown in FIG. 2A, the respective semiconductor layers 13 through 16 are crystal-grown by a metalorganic chemical vapor deposition (MOCVE) technique on the n-type GaN substrate 12.

Specifically, the Si-doped n-type $Ga_{0.9}Al_{0.1}N$ cladding layer 13 is deposited to be about 0.5 μm thick on the substrate 12 at a growth temperature of about 1050° C. Next, the growth temperature is lowered to about 800° C., at which the MQW active layer 14, made up of multiple pairs of undoped $In_{0.02}Ga_{0.98}N/In_{0.15}Ga_{0.85}N$ layers alternately stacked, is deposited thereon to be about 0.1 μm thick (where the thickness of each layer is about 5 nm). Then, the growth temperature is raised again to about 1050° C., at which the Mg-doped p-type $Ga_{0.9}Al_{0.1}N$ cladding layer 15 is deposited thereon to be about 0.5 μm thick. Subsequently, the Mg-doped p-type GaN electrode forming layer 16 is deposited thereon to be about 1 μm thick with the growth temperature maintained at about 1050° C.

Figure 2B:
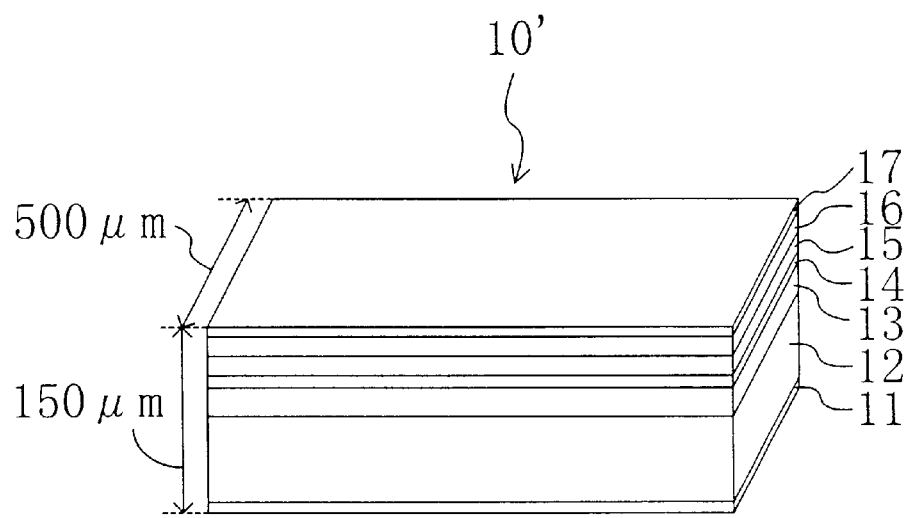

Next, as shown in FIG. 2B, the substrate 12 is polished until the total thickness of the assembly, including the substrate 12 and the respective semiconductor layers 13 through 16, reaches about 150 μm. Thereafter, a p-type electrode 17, made of multiple pairs of Ni/Au layers alternately stacked, and an n-type electrode 11, made of multiple pairs of Ti/Al layers alternately stacked, are formed by an evaporation technique on the electrode forming layer 16 and under the substrate 12, respectively. The resulting multilayer structure is cleaved or dry-etched, thereby obtaining the nitride semi-conductor laser diode 10 having the structure of a rectangular parallelepiped with a width of about 500 μm.

Figure 2C:
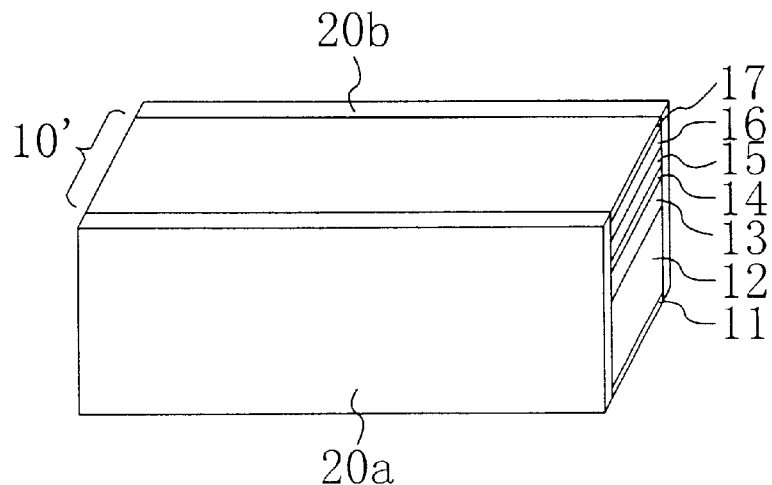

Then, as shown in FIG. 2C, the GaN protective layers 20a and 20b are formed to be about 0.16 μm thick on both laser facets of the nitride semiconductor laser diode 10'. These layers 20a and 20b are formed by an MOCVD process at a temperature of about 1000° C. In accordance with the MOCVD, material particles with high kinetic energy do not impact on the laser facets, and the facets are not damaged. Thus, on lattice defects are caused in the crystals grown on the substrate 12 during the deposition of the protective layers 20a and 20b. Similar effects are also attainable if the protective layers 20a and 20b are formed by a molecular beam epitaxy (MBE) process, not the MOCVD process.

The thermal expansion coefficient of GaN, which is the material for the protective layers 20a and 20b, is $3.17 \times 10^{-6}$ $k^{-1}$, which is very close to that of the MQW active layer 14 at $3.15 \times 10^{-6}$ $k^{-1}$. Accordingly, almost no strain is caused due to thermal stress between the MQW active layer 14 and the protective layers 20a and 20b during cooling to room temperature or during the operation of the device.

Supposing the refractive index n of GaN is 2.6 and the laser oscillation wavelength λ is 420 nm, the thickness of the protective layers 20a and 20b is defined in this embodiment at 0.16 μm, which is twice larger than λ/2n=0.08 μm. Alternatively, the thickness of the protective layers 20a and 20b may be N times as large as λ/2n, where N is a positive integer. In such a case, the oscillation properties of the laser device can be similar to those exhibited when the protective layers 20a and 20b are not formed. In view of the productivity, the thickness of the protective layers 20a and 20b is preferably λ/2n or λ/n.

Figure 2D:
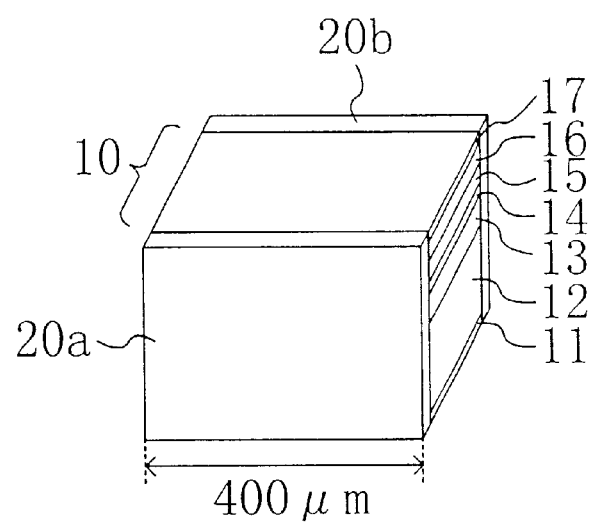

Finally, as shown in FIG. 2D, the assembly is cut off at a predetermined pitch (e.g., about 400 μm) to complete the nitride semiconductor laser device 100 having the laser diode 10 with a predetermined size.

In this embodiment, the energy band gap of the GaN protective layers 20a and 20b formed on the laser facets is 3.45 eV, which is larger than the energy (2.95 eV) of the laser light emitted from the MQW active layer 14 (oscillation wavelength: 420 nm). Accordingly, the laser light is not absorbed by the protective layers 20a and 20b but totally transmitted. Also, since the protective layers 20a and 20b are grown without doping, the resistivity of the protective layers 20a and 20b is $10^9$ Ω·cm or more. Thus, almost no leakage current flows through the protective layers 20a and 20b.

Figure 3:
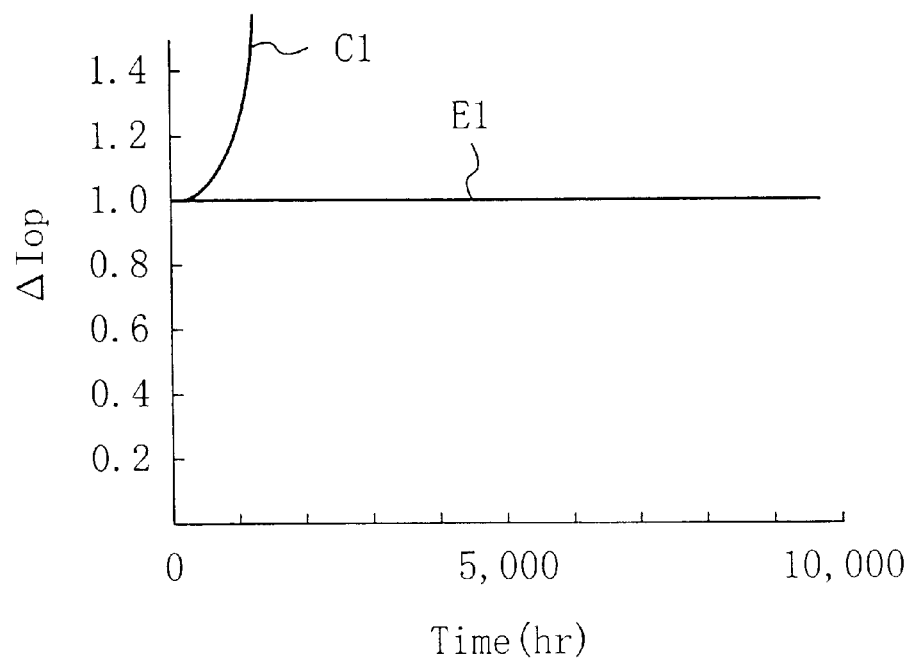
FIG. 3 is a graph illustrating the results of a life test carried out on the nitride semiconductor laser device of the first embodiment and a conventional nitride semiconductor laser device.
Figure 11:
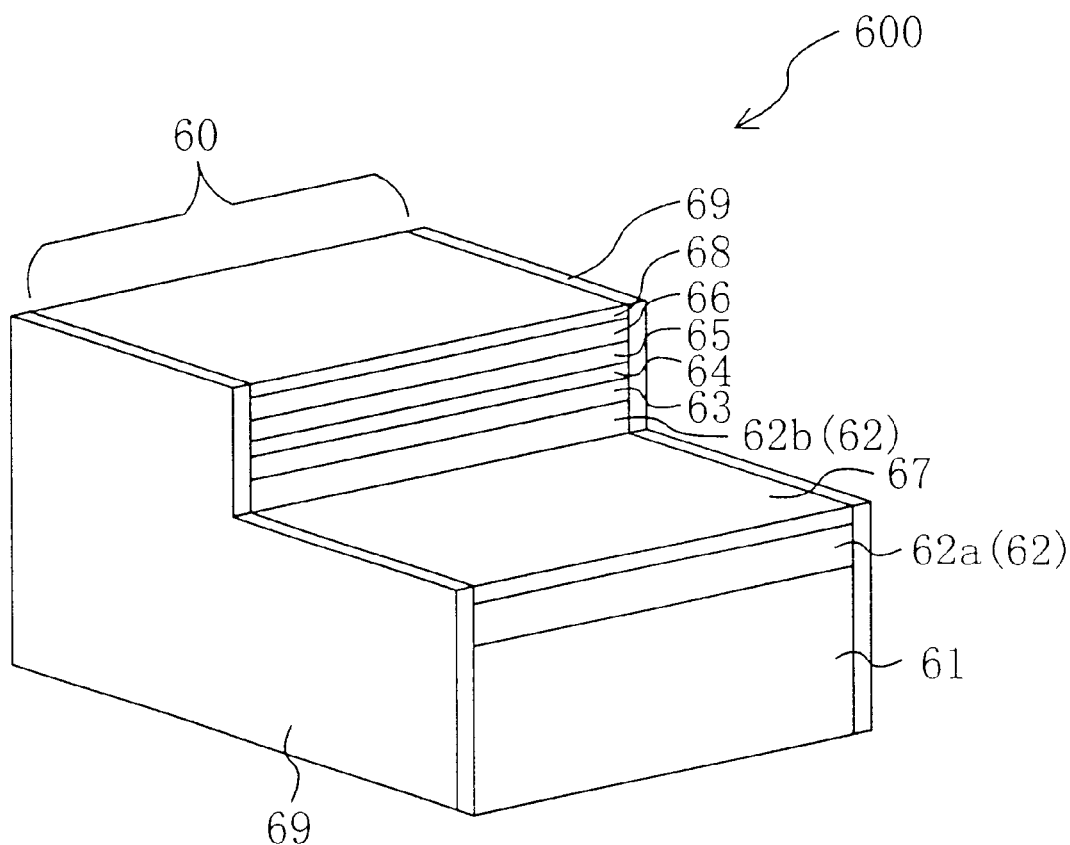
FIG. 11 is a perspective view illustrating a conventional nitride semiconductor laser device.

FIG. 3 illustrates the results of a life test carried out on the blue-light-emitting nitride semiconductor laser device 100 of the first embodiment and the conventional nitride semiconductor laser device 600 including an $SiO_2$ protective layer shown in FIG. 11. Specifically, FIG. 3 illustrates how the rate of variation ΔIop of the operating current changes with time. In FIG. 3, the line E1 represents the results on the nitride semiconductor laser device 100 of the first embodiment, while the curve C1 illustrates the results on the conventional nitride semiconductor laser device 600. The life test was performed with the operating current controlled under the conditions that the ambient temperature was set at 50° C., the oscillation wavelength was set at 420 nm and the output of the laser was controlled to be constant at 50 mw.

As shown in FIG. 3, the rate of variation of the operating current is still constant in the nitride semiconductor laser device 100 of the first embodiment even after the device 100 has operated for 10,000 hours. In contrast, in the conventional nitride semiconductor laser device 600, the rate of variation of the operating current abruptly increases on and after the device 600 has operated for 500 hours. As can be seen, the lifetime of the nitride semiconductor laser device 100 of the first embodiment is about 20 time longer than that of the conventional nitride semiconductor laser device 600. Analyzing these results, it is believed that such a long lifetime is attained according to the present invention because deterioration of the laser facets can be suppressed by the GaN protective layers 20a and 20b and because almost no lattice defects are created in the MQW active layer 14.

In this embodiment, the protective layers 20a and 20b are made of GaN. Alternatively, the protective layers 20a and 20b are preferably made of $Al_{1-x-y-z}Ga_xIn_yB_zN$ (where $0 \leq x$, y, $z \leq 1$, and $0 \leq x+y+z \leq 1$). The mole fractions x, y and z may be selected such that these layers are transparent to the light emitted by the laser diode. Since various nitride semiconductor compounds, containing Al, In and B, are usable for the protective layers 20a and 20b, the range of materials attainable excellent lattice matching can be expanded.

As just described, the protective layers 20a and 20b are preferably made of nitride semiconductor materials in order to establish lattice matching with the nitride semiconductor crystal layers constituting the semiconductor laser diode. Alternatively, any other material may also be used so long as the material can establish lattice matching with the nitride semiconductor crystal layers containing the semiconductor laser diode and have transparency to the oscillation wavelength of the laser diode. As can be easily understood, materials, which show high electrical resistivity and a thermal expansion coefficient close to that of the MQW active layer, are preferably used.

The MQW active layer 14 is also preferably made up of multiple pairs of $In_uGa_{1-u}N/In_vGa_{1-v}N$ (where $0 \leq u \leq 1$ and $0 \leq v \leq 1$) layers alternately stacked, for example. The structure and the method for producing the semiconductor laser diode 10 are known in the art. Japanese Laid-Open Patent Publication No. 9-219556 is hereby incorporated by reference.

The respective compositions of the protective layers 20a and 20b and the MQW active layer 14 are defined such that the layers 20a and 20b are transparent to the light emitted from the laser diode as described above. In addition, the compositions should also be selected such that a difference in lattice constant between the protective layers 20a, 20b and the MQW active layer 14 accounts for about 3% or less of the lattice constant of the MQW active layer 14. If the difference in lattice constant exceeds 3%, then lattice mismatching happens in the interfaces between the protective layers 20a, 20b and the MQW active layer 14. As a result, lattice defects are caused in the MQW active layer 14 and the lifetime of the nitride semiconductor laser device is sometimes shortened. It should be noted that if the protective layers 20a and 20b are sufficiently thick, then the lifetime of the laser may not be shortened even though lattice mismatching of more than 3% has happened. This is because the protective layers 20a and 20b can absorb the strain.

In addition, the compositions should also be selected such that a difference in thermal expansion coefficient between the protective layers 20a, 20b and the MQW active layer 14 accounts for about 20% or less of the thermal expansion coefficient of the MQW active layer 14.

In this embodiment, undoped semiconductor layers are grown as the protective layers 20a and 20b by an MOCVD or MBE process to increase the resistivity of these layers 20a and 20b. Optionally, to further increase the resistance, Group V atoms such as As or P atoms may be implanted thereto at such a level of about $10^{15}$ cm$^{-3}$ as compensating for nitrogen vacancies existing in the semiconductor layers. By increasing the resistance of the protective layers 20a and 20b, it is possible to prevent current from leaking through the protective layers 20a and 20b. The resistivity of the protective layers 20a and 20b is preferably equal to or higher than $10^5$ Ω·cm, more preferably equal to or higher than $10^9$ Ω·cm.

In the foregoing embodiment, cladding layers and active layer are formed on an n-type GaN substrate. An alternate nitride semiconductor laser diode may include: p-type GaAlN cladding layer; undoped InGaN/InGaN MQW active layer; n-type GaAlN cladding layer; n-type GaN electrode forming layer; and n-type Ti/Al electrode. All of these layers are stacked in this order on a p-type GaN substrate. The laser diode further includes a p-type Ni/Au electrode formed under the substrate. And thin layers of $Al_{1-x-y-z}Ga_xIn_yB_zN$ (where $0 \leq x, y \leq 1$, and $0 \leq x+y+z \leq 1$) may be provided as protective layers on the nitride semiconductor laser diode. In such an alternate embodiment, the same effects as those of the first embodiment are also attainable.

In this embodiment, the protective layers 20a and 20b are provided on both facets of the laser diode 10. Alternatively, only one protective layer may be provided on either facet thereof. The thickness of the protective layers 20a and 20b does not have to be N times as large as λ/2n, but may be N' times as large as λ/4n (where N' is a positive odd number) such that the light is reflected by the protective layers 20a and 20b which also function as reflective layers.

The alternative protective layer materials and the substitute laser diode structure described above are also applicable to the following embodiments.

EMBODIMENT 2

Figure 4A:
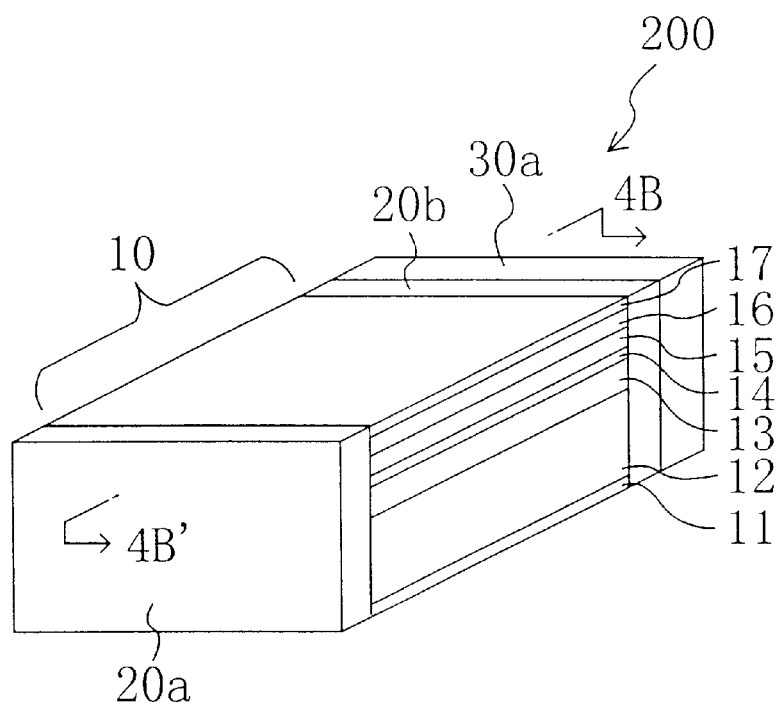
FIG. 4A is a perspective view of a nitride semiconductor laser device according to a second embodiment of the present invention.
Figure 4B:
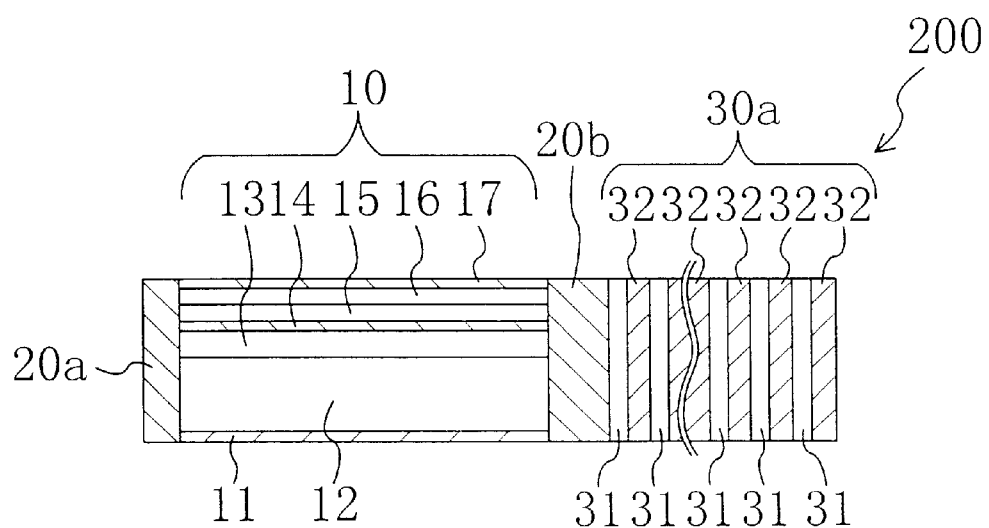
FIG. 4B is a cross-sectional view of the device taken along the line 4B—4B' in FIG. 4A.

Next, a nitride semiconductor laser device 200 according to a second embodiment of the present invention will be described with reference to FIGS. 4A and 4B. FIG. 4A is a perspective view of the device 200 of the second embodiment, while FIG. 4B is a cross-sectional view thereof taken along the line 4B–4B' in FIG. 4A.

The device 200 of the second embodiment is different from the device 100 of the first embodiment in that the device 200 further includes a reflective layer 30a on the outer face of the protective layer 20b formed on the back of the semiconductor laser diode 10. Also, in the device 200 of the second embodiment, the respective thickness of the protective layers 20a and 20b, formed on the front (light-emitting face) and the back of the semiconductor laser diode 10, are about 0.08 μm and about 0.16 μm, respectively. In the other respects, the structure of the device 200 is substantially the same as that of the device 100. Thus, the elements with substantially the same functions are identified by the same reference numerals and the detailed description thereof will be omitted herein.

The relative layer 30a of the device 200 is formed by alternatively stacking eight pairs of nitride semiconductor layers with mutually different refractive indices, e.g., AlN layers 31 (thickness: about 0.05 μm) and GaN layers 32 (thickness: about 0.04 μm). The thickness of each of these nitride semiconductor layers 31 and 32 is represented by λ/4 n, where λ is an oscillation wavelength of the laser diode (e.g., 420 nm) and n is a refractive index of each layer 31 or 32. As a result, the reflectance at the back is about 93%. Also, since these nitride semiconductor layers 31 and 32 are undoped semiconductor layers, the resistivity thereof is $10^9$ Ω·cm or more. Accordingly, no leakage current flows through these nitride semiconductor layers 31 and 32.

The nitride semiconductor laser device 200 is fabricated in the following manner. First, the semiconductor laser diode 10' is formed as shown in FIG. 2B as in the first embodiment.

Next, as in the first embodiment, the GaN protective layer 20b is formed to be about 0.16 μm thick on the back of the laser diode 10'. The protective layer 20b is formed by an MOCVD process at about 1000° C., which is slightly lower than the growth temperature of the semiconductor laser diode (with a double heterostructure). This thickness is set at twice as large as λ/2n=0.08 μm, where the refractive index n of GaN is 2.6 and the oscillation wavelength λ of the laser diode is 420 nm. It should be noted, however, that the thickness of the protective layer 20b does not have be exactly twice of λ/2n. This is because the interface between the protective layer 20b and the AlN layer 31 formed thereon serves as a facet of the laser cavity. That is to say, since the length of the cavity increases only by the thickness of the protective layer 20b, the oscillation properties of the laser diode, such as the operating current thereof, are hardly affected if the thickness of the protective layer 20b is variable to a certain degree.

Next, the eight pairs of nitride semiconductor layers of the two types, namely, the AlN layers 31 (thickness: about 0.05 μm) and the GaN layers 32 (thickness: about 0.04 μm), are alternately stacked on the protective layer 20b, thereby forming the reflective layer 30a thereon. The thickness of each of the AlN layers 31 and the GaN layers 32 are represented by λ/4n, where λ is the oscillation wavelength of the laser diode (e.g., 420 nm) and n is the refractive index of each AlN or GaN layer 31 or 32 (i.e., 2.0 and 2.6, respectively). As a result, the reflectance at the back of the semiconductor laser diode 10' is about 93%. Also, since these AlN and GaN layers 31 and 32 have been grown without doping, the resistivity thereof is $10^9$ Ω·cm or more. Accordingly, no leakage current flows through the AlN and GaN layers 31, 32.

Subsequently, as in the first embodiment, the GaN protective layer 20a is formed on the front of the semiconductor laser diode 10'. In this embodiment, the thickness of the protective layer 20a is set at about 0.08 μm, which is also defined by $\lambda/2n$. It is noted that the protective layer 20b and the reflective layer 30a may be deposited on the back of the semiconductor laser diode 10' after the protective layer 20a has been deposited on the front of the laser diode 10'.

Finally, the resultant multilayer structure is cleaved at a pitch of about 400 μm as in the first embodiment. In this manner, the nitride semiconductor laser device 200 of the second embodiment having the laser diode 10 with a predetermined size is completed.

According to the second embodiment, the lifetime of the semiconductor laser device can be extended as in the first embodiment. In addition, a high reflectance is also attained.

It should be noted that various other nitride semiconductor compounds are usable for the reflective layer 30a, as well as for the protective layers 20a and 20b of the first embodiment. Specifically, the reflective layer 30a is preferably made of $Al_{1-x-y-z}Ga_xIn_yB_zN$ (where $0 \leq x, y, z \leq 1$, and $0 \leq x+y+z \leq 1$). The mole fraction x, y and z may be selected such that the reflective layer is transparent to the light emitted from the laser diode. The same statement applies to the following embodiments.

EMBODIMENT 3

Figure 5:
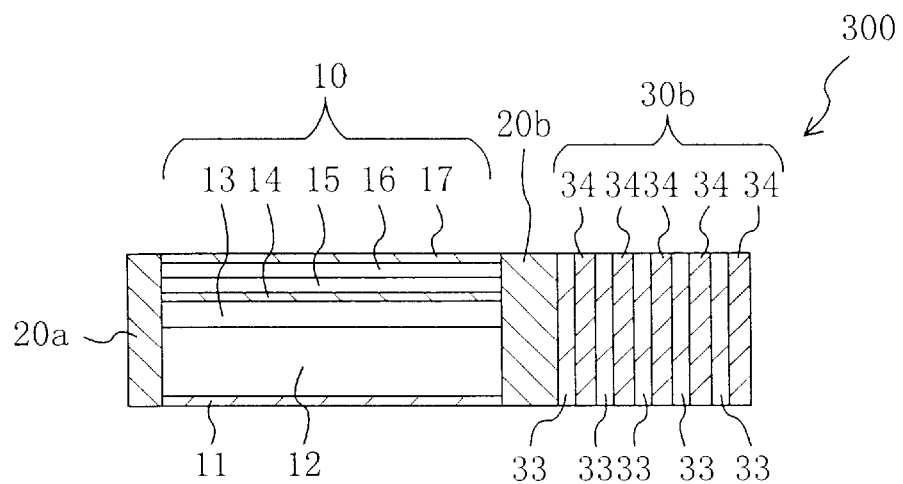
FIG. 5 is a cross-sectional view of a nitride semiconductor laser device according to a third embodiment of the present invention.

FIG. 5 illustrates a cross section of a nitride semiconductor laser device 300 according to a third embodiment of the present invention. The device 300 of the third embodiment is different from the device 200 of the second embodiment in the structure of a reflective layer 30b. In the other respects, the structure of the device 300 is substantially the same as that of the device 200. Thus, the elements with substantially the same functions are identified by the same reference numerals and the detailed description thereof will be omitted herein.

The reflective layer 30b of the nitride semiconductor laser device 300 is formed by alternately stacking five pairs of insulating layers of two types, namely, $SiO_2$ layers 33 and $TiO_2$ layers 34, on the GaN protective layer 20b provided on the back of the laser diode 10. The thickness of each of these layers 33 and 34 is represented by $\lambda/4n$, where $\lambda$ is the oscillation wavelength of the laser diode and n is a refractive index of each layer 33 or 34. The protective layer 20a with a thickness defined by $\lambda/2n$ is formed on the front of the laser diode 10.

Hereinafter, a method for fabricating this nitride semiconductor laser device 300 will be briefly described. The same process steps as those of the second embodiment are performed until the protective layer 20b is formed to be about 0.16 μm thick on the back of the laser diode 10' as shown in FIG. 2C.

Next, the five pairs of insulating layers of the two types with mutually different refractive indices, namely, the $SiO_2$ layers 33 (thickness: about 0.07 μm) and the $TiO_2$ layers 34 (thickness: about 0.04 μm), are alternately stacked on the protective layer 20b. The thickness of each of these layers 33 and 34 is represented by $\lambda/4n$, where $\lambda$ is the oscillation wavelength of the laser diode (e.g., 420 nm). As a result, the reflectance at the back of the laser diode 10 is about 98%. Also, these $SiO_2$ and $TiO_2$ layers 33 and 34 are formed on the protective layer 20b, and do not directly affect the facet of the active layer 14 in the semiconductor laser diode 10' during the deposition process thereof. Accordingly, these $SiO_2$ and $TiO_2$ layers 33 and 34 may be formed by a sputtering or EB evaporation technique. However, in order to minimize the damage done to the crystal layers in the semiconductor laser diode 10', these $SiO_2$ and $TiO_2$ layers 33 and 34 are preferably grown by an MBE technique.

Thereafter, a GaN protective layer 20a with a thickness defined by $\lambda/2n$ (e.g. 0.08 μm) is formed on the front of the semiconductor laser diode 10'. By performing the same process steps as those of the second embodiment after that, the nitride semiconductor laser device 300 is completed.

According to the third embodiment, the lifetime of the semiconductor laser device can be extended as in the first embodiment and a high reflectance is attained as well.

EMBODIMENT 4

Figure 6:
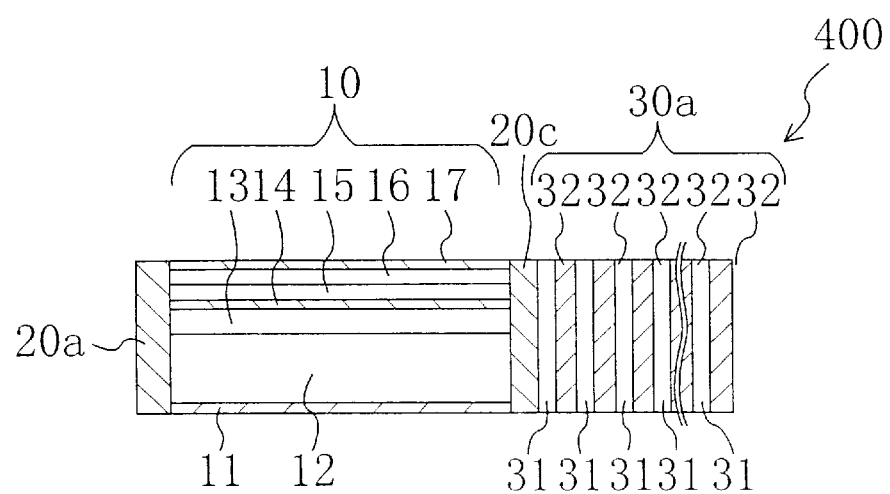
FIG. 6 is a cross-sectional view of a nitride semiconductor laser device according to a fourth embodiment of the present invention.

FIG. 6 illustrates a cross section of a nitride semiconductor laser device 400 according to a fourth embodiment of the present invention. The device 400 of the fourth embodiment is different from the device 200 of the second embodiment in the structure of a protective layer 20c formed on the back of the semiconductor laser diode 10. In the other respects, the structure of the device 400 is substantially the same as that of the device 200. Thus, the elements with substantially the same functions are identified by the same reference numerals and the detailed description thereof will be omitted herein.

The GaN protective layer 20c formed on the back of the laser diode 10 has a thickness defined by $\lambda/4n$, where $\lambda$ is the oscillation wavelength of the laser diode and n is a refractive index of the protective layer 20c. A reflective layer 30a is also formed on the protective layer 20c by alternately stacking thereon eight pairs of nitride semiconductor layers of two types, namely, AlN layers 31 and GaN layers 32. The thickness of each of these layers 31 and 32 is also defined by $\lambda/4n$. And the GaN protective layer 20a with a thickness defined by $\lambda/2n$ is formed on the front of the semiconductor laser diode 10.

Since the protective layer 20c of the device 400 serves as a reflective layer, the reflectance at the back of the device 400 is higher than the device 200 of the second embodiment. As a result, a reflectance as high as about 95% is attained in this embodiment. The thickness of the protective layer 20c is not necessarily defined by $\lambda/4n$, but may be N' times as large as $\lambda/4n$, where N' is a positive odd number. In view of the productivity, the thickness of the protective layer 20c is preferably $\lambda/4n$.

Figure 7:
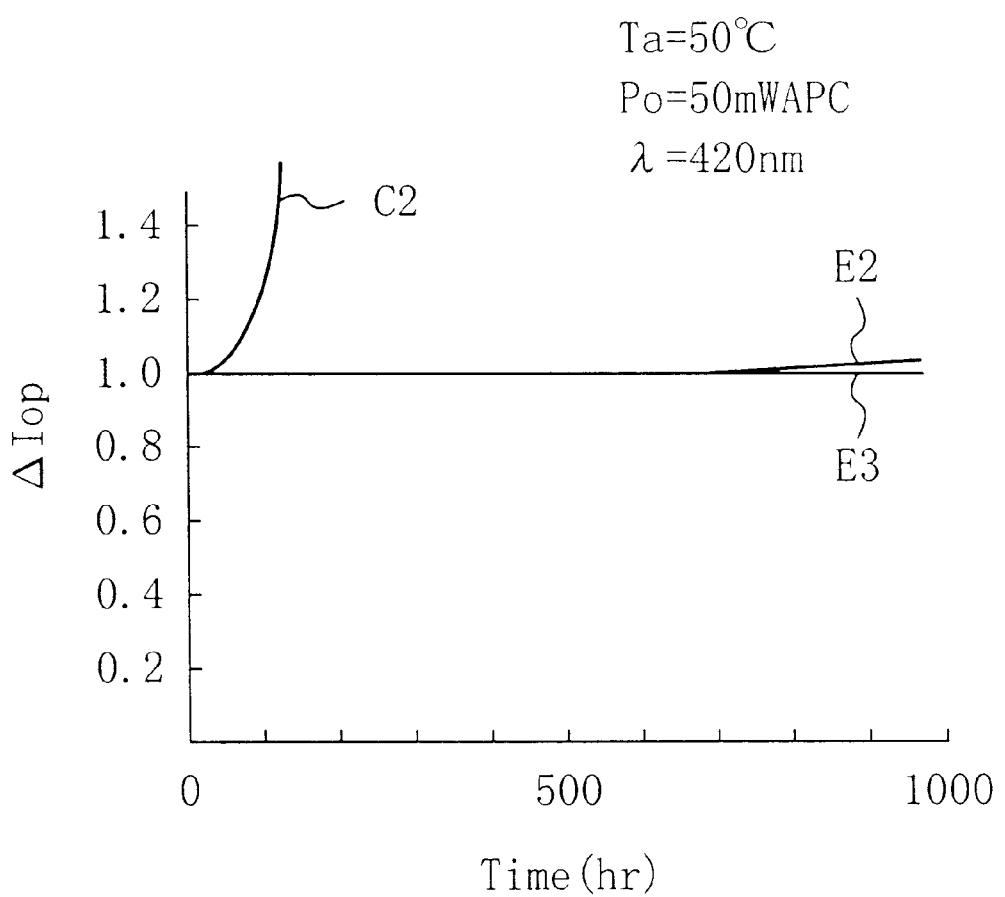
FIG. 7 is a graph illustrating the results of a life test carried out on the nitride semiconductor laser devices of the second, third and fourth embodiments and a conventional nitride semiconductor laser device.
Figure 12A:
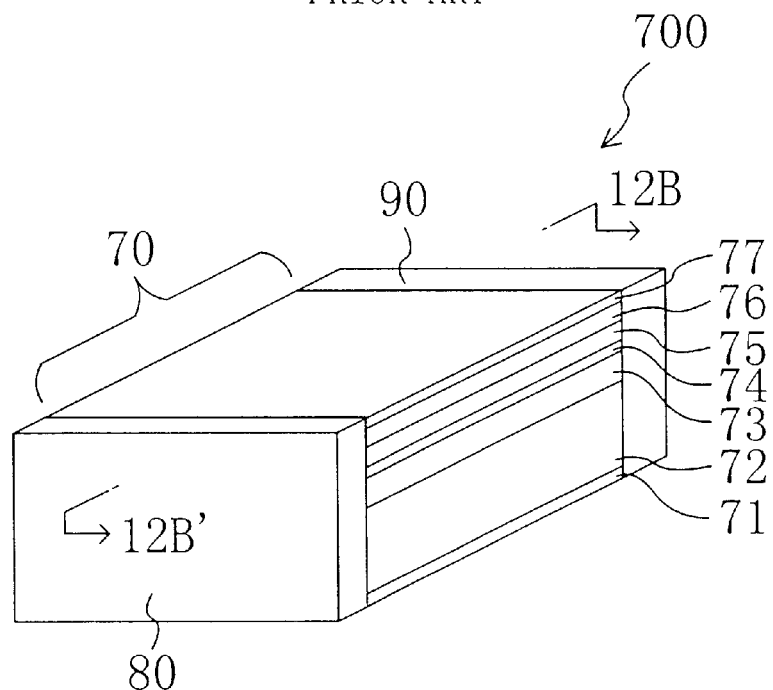
FIG. 12A is a perspective view illustrating another conventional nitride semiconductor laser device.
Figure 12B:
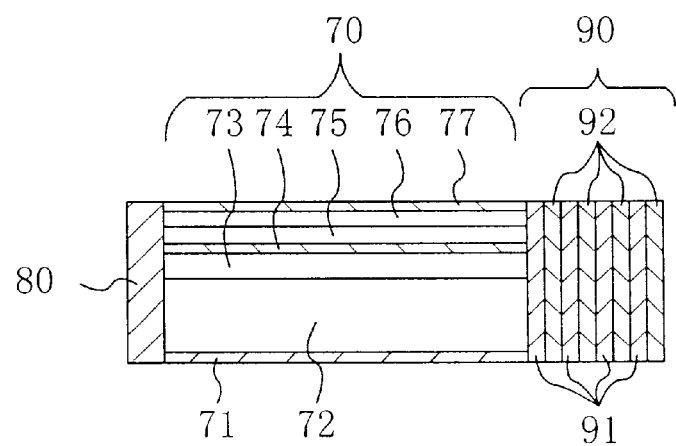
FIG. 12B is a cross-sectional view of the nitride semiconductor laser device shown in FIG. 12A.

FIG. 7 illustrates the results of a life test carried out on the devices 200, 400 (E2 in FIG. 7) and 300 (E3 in FIG. 7) of the second, third and fourth embodiments and the conventional device 700 (C2 in FIG. 7) illustrated in FIGS. 12A and 12B. Specifically, FIG. 7 illustrates how the rates of variation ΔIop of the operating current change in the respective devices with time at a temperature of 50° C. and and output power of 50 mW.

As shown in FIG. 7, no deterioration has happened in the device 200, 300 and 400 according to the present invention even after the devices have been operated at a high output power for 1000 hours. That is to say, as can be understood, the deterioration at the facets can be suppressed by the protective layers and such a long lifetime is attained because a very small number of deficiencies are introduced into the active layer.

As described above, according to the foregoing second through fourth embodiments, the lifetime of the semiconductor laser device can be extended as in the first embodiment, and an even higher reflectance is attained as well.

EMBODIMENT 5

Figure 8:
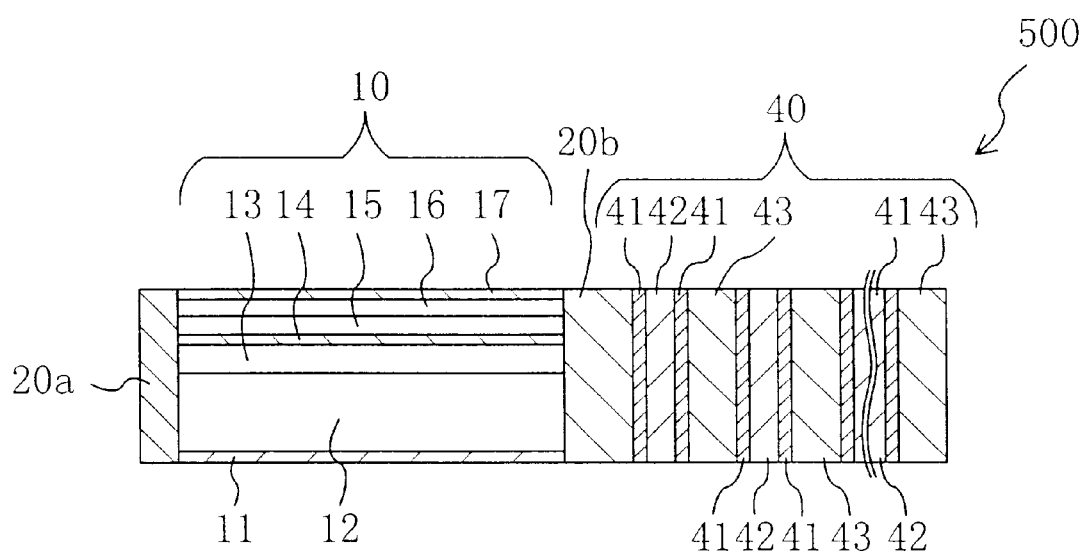
FIG. 8 is a cross-sectional view of a nitride semiconductor laser device according to a fifth embodiment of the present invention.

FIG. 8 illustrates a cross section of a nitride semiconductor laser diode device 500 according to a fifth embodiment of the present invention. The device 500 of the fifth embodiment is different from the device 200 of the second embodiment in the structure of a reflective layer 40 formed on the back of the semiconductor laser diode 10. In the other respects, the structure of the device 500 is substantially the same as that of the device 200. Thus, the elements with substantially the same functions are identified by the same reference numerals and the detailed description thereof will be omitted herein.

In the nitride semiconductor laser device 500, 16 sets of multilayer structures, each consisting of: $Al_{0.5}Ga_{0.5}N$ layer 41 (thickness: 0.01 μm); AlN layer 42 (thickness: 0.03 μm); $Al_{0.5}Ga_{0.5}N$ layer 41 (thickness: 0.01 μm); and GaN layer 43 (thickness: 0.04 μm), are stacked on the GaN protective layer 20b formed on the back of the semiconductor laser diode 10. The GaN protective layer 20a with a thickness defined by $\lambda/2n$ is formed on the front of the laser diode 10. n is formed on the front of the laser diode 10.

Hereinafter, a method for fabricating this device 500 will be briefly described. The same process steps as those of the second embodiment are performed until the protective layer 20b is formed to be about 0.16 μm thick on the back of the semiconductor laser diode 10' as shown in FIG. 2C.

Next, 16 sets of multilayer structures, each consisting of: $Al_{0.5}Ga_{0.5}N$ layer 41 (thickness: 0.01 μm); AlN layer 42 (thickness: 0.03 μm); $Al_{0.5}Ga_{0.5}N$ layer 41 (thickness: 0.01 μm); and GaN layer 43 (thickness: 0.04 μm), are stacked by an MOCVD or MBE process on the protective layer 20b. These nitride semiconductor layers 41, 42 and 43 are preferably made of $Al_{1-x-y-z}Ga_xIn_yB_zN$ (where $0 \leq x, y, z \leq 1$, and $0 \leq x+y+z \leq 1$). The mole fractions x, y and z may be selected such that these layers are transparent to the light emitted from the laser diode. the lattice constants and thermal expansion coefficients of these layers should preferably be matched with each other and the electrical resistivity of these layers should preferably be high.

The respective thickness of the $Al_{0.5}Ga_{0.5}N$ 41/AlN 42/$Al_{0.5}Ga_{0.5}N$ 41/GaN 43 layers are defined by $\lambda/20n$, $3\lambda/20n$, $\lambda/20n$ and $\lambda/4n$, where $\lambda$ is the oscillation wavelength of the laser diodes and n is a refractive index of each of these layers. The thickness of the $Al_{0.5}GA_{0.5}N$ layer 41 is not limited to $\lambda/20n$ so long as the total thickness of the $Al_{0.5}Ga_{0.5}N$ 41AlN 42/$Al_{0.5}Ga_{0.5}N$ 41 layers is $\lambda/4n$. As a result, the reflectance at the back of the laser cavity can be as high as about 99%. Also, since the respective nitride semiconductor layers, included in the reflective layer 40, are grown without doping, the resistivity of each layer is $10^9$ Ω·cm or more. Thus, almost no leakage current flows through the reflective layer 40.

Thereafter, GaN protective layer 20a with a thickness defined by $\lambda/2n$ (e.g., 0.08 μm) is formed on the front of the semiconductor laser diode 10'. By performing the same process steps as those of the second embodiment after that, the nitride semiconductor laser device 500 is completed.

Figure 9:
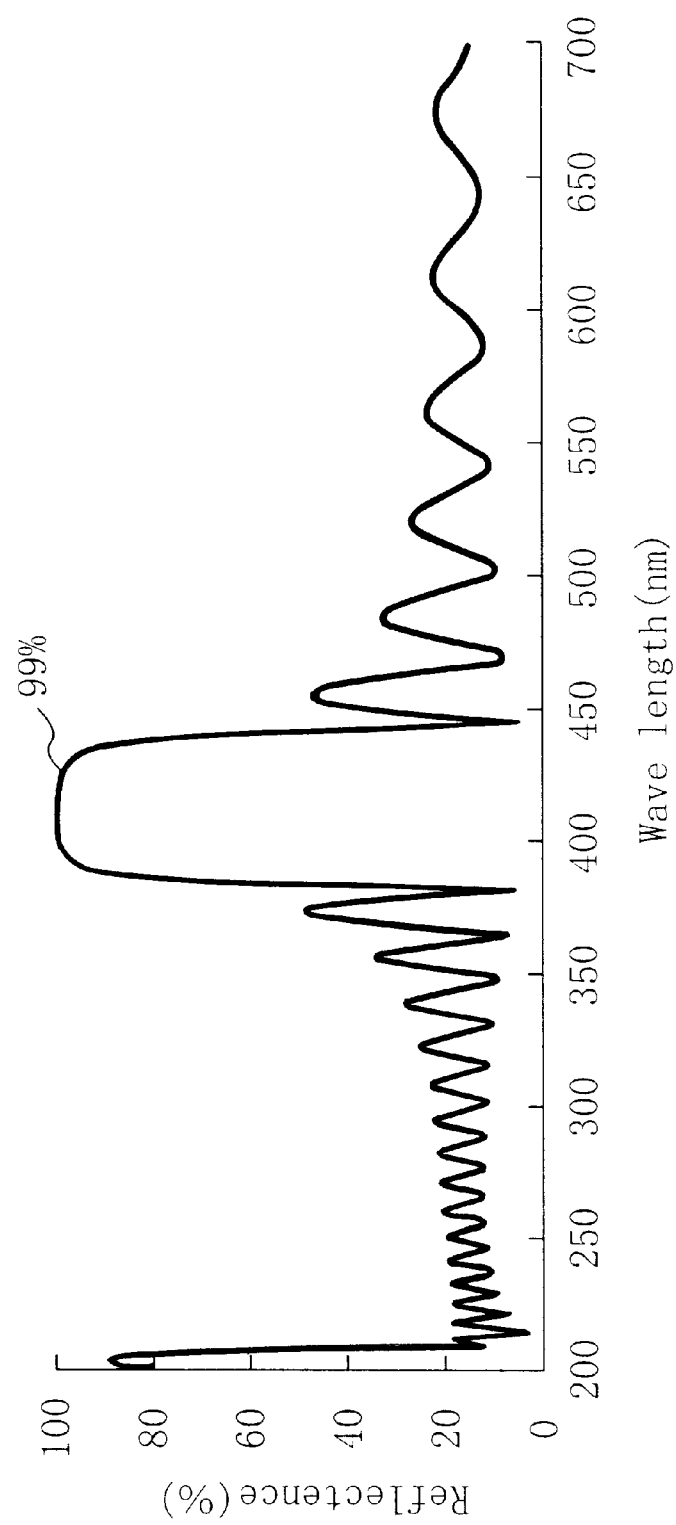
FIG. 9 is a graph illustrating a relationship between a wavelength at the reflective layer and a calculated reflectance at the facet in the nitride semiconductor laser device of the fifth embodiment.

FIG. 9 illustrates a relationship between a wavelength at the reflective layer 40 and an associated calculated reflectance at the facet. As shown in FIG. 9, the reflectance reaches as high as 99% when the wavelength is 420 nm. the number of layers included in the multilayer reflective layer 40 may be appropriately selected to attain a required reflectance.

A substantially equal reflectance is attainable if at least one two-layered structure consisting of AlN layer 42 and GaN layer 43, each having a thickness defined by $\lambda/4n$ (e.g., 0.05 μm and 0.04 μm), is formed periodically instead of the reflective layer 40. However, in this two-layered structure, the difference in lattice constant is slightly less than 2% at room temperature. Accordingly, the AlN layer 42 is particularly likely to be strained due to tensile strain applied thereto. To relax the strain resulting from lattice mismatching, an $Al_{0.5}Ga_{0.5}N$ layer 41 with a lattice constant intermediate between those of the AlN and GaN layers 42 and 43 should be inserted between the AlN and GaN layers 42 and 43. In such a case, the lifetime of the semiconductor laser device can be further extended.

If the strain resulting from lattice mismatching is to be further relaxed, then multiple $Al_qGa_{1-q}As$ layers (where $0 \leq q \leq 1$) may be inserted instead of the $Al_{0.5}Ga_{0.5}N$ layer 41 between the AlN and GaN layers 42 and 43 or multiple layers, where the value of q continuously changes from 0 to 1, may be formed therebetween.

EMBODIMENT 6

According to a sixth embodiment of the present invention, the GaN protective layer 20b, formed on the back of the semiconductor laser diode 10, is omitted from the nitride semiconductor laser diode 500 of the fifth embodiment. Instead, 16 sets of four-layered structures, each consisting of: $Al_{0.5}Ga_{0.5}N$ layer 41 (thickness: 0.01 μm); AlN layer 42 (thickness: 0.03 μm); $Al_{0.5}Ga_{0.5}N$ layer 41 (thickness: 0.01 μm); and GaN layer 43 (thickness: 0.04 μm), are stacked directly on the back of the laser diode 10. In accordance with such a structure, a reflective layer with a high reflectance can also be attained.

Alternatively, an $In_{0.02}Ga_{0.98}N$ layer may be formed as a substitute protective layer directly on the back of the semiconductor laser diode 10. Also, the protective layer may have a thickness N' times as large as $\lambda/4n$ (where N' is a positive odd number) to function as a reflective layer.

Figure 10:
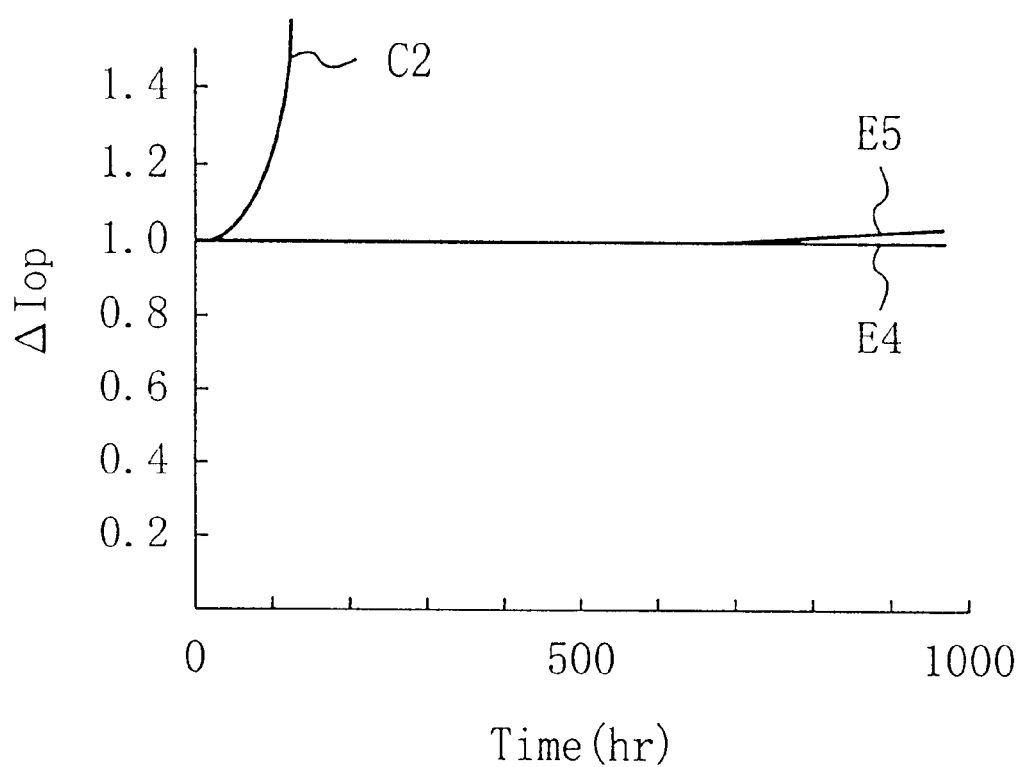
FIG. 10 is a graph illustrating the results of a life test carried out on the nitride semiconductor laser devices of the fifth and sixth embodiments and the conventional nitride semiconductor laser device.

FIG. 10 illustrates the results of a life test carried out on the nitride semiconductor laser devices of the fifth and sixth embodiments (E4 and E5 in FIG. 10) and the conventional nitride semiconductor laser diode 700 illustrated in FIGS. 12A and 12B (C3 in FIG. 10). Specifically, FIG. 10 illustrates how the rates of variation $\Delta$Iop of the operating current change in the respective devices with time at a temperature of 50° C. and an output power of 50 mW.

As shown in FIG. 10, no deterioration has happened in the devices according to the fifth and sixth embodiments even after the devices have been operated at a high output power for 1000 hours. That is to say, as can be understood, the deterioration at the facets can be suppressed by the protective layers and such a long lifetime is attained because a very small number of deficiencies are introduced into the active layer.

As described above, according to the fifth and sixth embodiments, the lifetime of the semiconductor laser device can be extended as in the first embodiment, and an even higher reflectance is attained as well.

In order to sufficiently increase the electrical resistivity of the respective nitride semiconductor layers included in the reflective layer 40 according to the fifth and sixth embodiments, undoped layers may be formed by an MOCVD or MBE process. Optionally, to further increase the resistance, Group V atoms such as As or P atoms may be implanted thereto at such a level of about $10^{15}$ cm$^{-3}$ as compensating for nitrogen vacancies existing in the conductive layers.

In a multilayer structure consisting of two or more types of insulating layers or high-resistance semiconductor layers, if the lattice constants of two adjacent layers are greatly different at room temperature, then a third layer should be inserted therebetween to reduce the difference in lattice constant between these two layers. In this manner, a reflective layer can be formed substantially without straining the active layer. Furthermore, if these layers are formed by an MOCVD or MBE process, then the damage done to the laser facets during the deposition process can be drastically reduced. Moreover, since a material with a thermal expansion coefficient very close to that of the active layer is used, the strain at room temperature can also be relaxed.

In the foregoing embodiments, a reflective layer is supposed to be formed only on the rear facet of each semiconductor laser diode. If a low threshold voltage should be attained at the expense of the output power of the laser, however, another reflective layer may be provided on the light-emitting end of the laser diode. In such a case, the reflectance of each reflective layer may be appropriately set depending on the applications thereof.

Thus, the present invention provides a nitride semiconductor laser device with a long lifetime, which can operate reliably enough not only when the output power thereof is low, but also even when the output power is too high for a conventional device to operate normally due to strain or defects. The nitride semiconductor laser device of the present invention is applicable as a blue-light-emitting laser device to a compact disk reproducing system and so on.

While the present invention has been described in a preferred embodiment, it will be apparent to those skilled in the art that the disclosed invention may be modified in numerous ways and may assume many embodiments other than that specifically set out and described above. Accordingly, it is intended by the appended claims to cover all modifications of the invention which fall within the true spirit and scope of the invention.

What is claimed is:

1. A nitride semiconductor laser device comprising:
   a nitride semiconductor laser diode; and
   a protective layer formed on at least one facet of the nitride semiconductor laser diode,
   wherein the protective layer is made of $Al_{1-x-y-z}Ga_xIn_yB_zN$ (where $0 \leq x, y, z \leq 1$ and $0 \leq x+y+z \leq 1$), which is transparent to light emitted from the laser diode.

2. The device of claim 1, wherein the thickness of the protective layer is N times as large as $\lambda/2n$, where N is a positive integer, $\lambda$ is an oscillation wavelength of the light emitted from the laser diode and n is a refractive index of the protective layer.

3. The device of claim 1, wherein the nitride semiconductor laser diode includes a multi-quantum well active layer made up of multiple pairs of $In_uGa_{1-u}N$ and $In_vGa_{1-v}N$ (where $0 \leq u, v \leq 1$) layers alternatively stacked one upon the other.

4. The device of claim 1, wherein the protective layer is formed by an MOCVD or MBE process.

5. The device of claim 1, further comprising a reflective layer in contact with the protective layer, the reflective layer reflecting the light emitted from the laser diode.

6. The device of claim 5, wherein the reflective layer is made up of at least one pair of first and second layers, which have mutually different refractive indices and are alternately stacked one upon the other.

7. The device of claim 6, wherein the thickness of the first and second layers are defined by $\lambda/4n_1$ and $\lambda/4n_2$, respectively, where $\lambda$ is an oscillation wavelength of the light emitted from the laser diode and $n_1$ and $n_2$ are refractive indices of the first or second layers respectively.

8. The device of claim 5, wherein the thickness of the protective layer is N times as large as $\lambda/2n$, where N is a positive integer, $\lambda$ is an oscillation wavelength of the light emitted from the laser diode and n is a refractive index of the protective layer.

9. The device of claim 5, wherein the thickness of the protective layer is defined by $\lambda/4n$, where $\lambda$ is an oscillation wavelength of the light emitted from the laser diode and n is a refractive index of the protective layer.

10. The device of claim 6, wherein the protective layer is made of GaN and
    wherein the first and second layers are made of $SiO_2$ and $TiO_2$, respectively, or two types of $Al_{1-\alpha-\beta-\gamma}Ga_\alpha In_\beta B_\gamma N$ (where $0 \leq \alpha, \beta, \gamma \leq 1$ and $0 \leq \alpha+\beta+\gamma \leq 1$), which have mutually different refractive indices and are transparent to light emitted from the laser diode.

11. The device of claim 6, wherein the reflective layer further includes a third layer between the first and second layers, and
    wherein the first, second and third layers are all crystal layers, and
    wherein a difference in lattice constant between the first and third layers is smaller than a difference in lattice constant between the first and second layers.

12. The device of claim 11, wherein the protective layer is made of GaN, and the reflective layer, which is made up of the first, third and second layers stacked in this order, has a GaN/AlGaN/AlN structure.

13. The device of claim 5, wherein the protective layer and the reflective layer are formed by an MOCVD or MBE process.

* * * * *